(12) United States Patent
Kuo

(10) Patent No.: US 10,440,814 B2
(45) Date of Patent: Oct. 8, 2019

(54) IMPEDANCE MATCHING STRUCTURE OF TRANSMISSION LINE IN MULTILAYER CIRCUIT BOARD

(71) Applicant: Alpha Networks Inc., Hsinchu (TW)

(72) Inventor: Rong- Fa Kuo, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 0 days.

(21) Appl. No.: 16/153,878

(22) Filed: Oct. 8, 2018

(65) Prior Publication Data

US 2019/0045626 A1    Feb. 7, 2019

Related U.S. Application Data

(63) Continuation-in-part of application No. 15/336,991, filed on Oct. 28, 2016, now Pat. No. 10,128,810.

(30) Foreign Application Priority Data

May 6, 2016    (TW) .............................. 105114171 A

(51) Int. Cl.
*H03H 7/38*    (2006.01)
*H05K 1/02*    (2006.01)
(Continued)

(52) U.S. Cl.
CPC ............. *H05K 1/0251* (2013.01); *H03H 7/38* (2013.01); *H05K 1/115* (2013.01); *H05K 1/16* (2013.01);
(Continued)

(58) Field of Classification Search
CPC .. H03H 7/38; H01P 5/02; H01P 5/028; H05K 1/025; H05K 1/0251; H05K 1/0222; H05K 3/429; H05K 2201/0979
See application file for complete search history.

(56) References Cited

U.S. PATENT DOCUMENTS 6,538,538 B2   3/2003  Hreish et al.
7,157,987 B2   1/2007  Brunker et al.
(Continued)

FOREIGN PATENT DOCUMENTS

CN     102333413      1/2012
JP     2004146810     5/2004
(Continued)

OTHER PUBLICATIONS

Taiwan Intellectual Property Office, "Notice of allowance" dated Nov. 29, 2017, Taiwan.
Japan Patent Office, "Office Action" dated Oct. 3, 2017, Japan.

*Primary Examiner* — Stephen E. Jones
(74) *Attorney, Agent, or Firm* — WPAT, PC

(57) ABSTRACT

An impedance matching structure is disposed on a multilayer circuit board for matching an impedance of a transmission line for transmitting an electronic signal. At least one redundant conducting section is coupled to a conductive member of the transmission line between input and output terminals of the transmission line. The conductive member and the redundant conducting section are disposed in a corresponding plating hole. At least one grounding member disposed adjacent to but separated from either or both of the conductive member of the transmission line and the at least one redundant conducting section in a capacitor structure for impedance matching. The at least one grounding member includes a first grounding member penetrating through at least two layers of the multilayer circuit board.

20 Claims, 9 Drawing Sheets

(51) Int. Cl.
*H05K 1/11* (2006.01)
*H05K 1/16* (2006.01)
*H05K 3/42* (2006.01)

(52) U.S. Cl.
CPC ......... *H05K 1/0222* (2013.01); *H05K 1/0298* (2013.01); *H05K 3/429* (2013.01); *H05K 2201/09236* (2013.01)

(56) References Cited

U.S. PATENT DOCUMENTS

| | | |
|---|---|---|
| 7,535,321 B1 | 5/2009 | Degerstrom et al. |
| 7,633,766 B2 | 12/2009 | Regnier et al. |
| 8,143,966 B2 | 3/2012 | Merritt |
| 8,334,734 B2 | 12/2012 | Achour |
| 8,441,327 B2 | 5/2013 | Zhou et al. |
| 8,742,993 B2 | 6/2014 | Lee et al. |
| 2008/0084679 A1 | 4/2008 | Baker et al. |

FOREIGN PATENT DOCUMENTS

| | | |
|---|---|---|
| JP | 2008091707 | 4/2008 |
| JP | 2008218497 | 9/2008 |

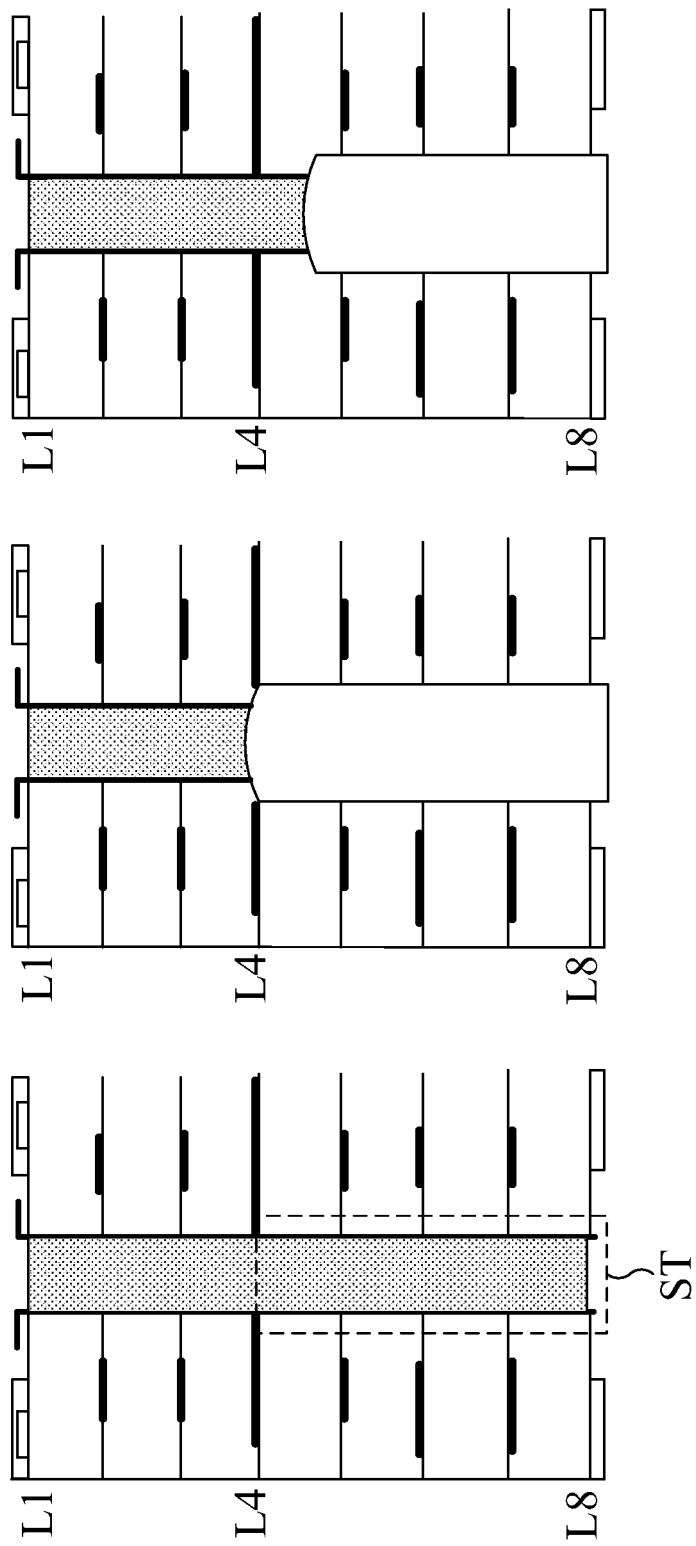

IMPEDANCE MATCHING STRUCTURE OF TRANSMISSION LINE IN MULTILAYER CIRCUIT BOARD

CROSS-REFERENCE TO RELATED APPLICATIONS

The present application is a continuation-in-part application claiming benefit from a parent U.S. patent application bearing a Ser. No. 15/336,991 and filed Oct. 28, 2016, contents of which are incorporated herein for reference.

FIELD OF THE INVENTION

The present invention relates to an impedance matching structure of a transmission line, and more particularly to an impedance matching structure of a transmission line in a multilayer circuit board.

BACKGROUND OF THE INVENTION

In order to maintain signal transmission quality of a transmission line in a higher frequency for a higher data transmission rate, whole characteristic impedance matching should be taken into consideration in a circuit design phase. Therefore, the characteristic impedance matching is even more critical for high-frequency circuit throughout a transmission line. For assuring of satisfactory high-frequency signal transmission accuracy, the characteristic impedance throughout the transmission path needs to be made consistent.

For improving the characteristic impedance matching effect, a variety of factors including width of traces, clearance between traces, plating hole structures of a multilayer printed circuit board, e.g. non-through holes or through holes, and conductor structures in the holes need to be precisely considered and well designed. For example, the characteristics of each plating hole, including pad size, pad shape, hole depth, and hole type, e.g. through hole, via, blind hole or buried hole, location of stub portion without signal transmission, and conductive structure inside the multilayer board, would have effects on signal transmission quality more or less.

In conventional designs, blind holes, buried holes or back-drilled holes are adopted to ameliorate signal reflection from the non-transmission stub portion. Please refer to FIG. 1A. For making traces of a circuit board from the first layer L1 to the fourth layer L4 by way of through holes, it is generally necessary to remove the stub portions ST of the circuit board disposed between the fourth layer L4 and the eighth layer L8. It is understood that the removal of the stub portions ST by back drilling requires precise control. Over drilling, as exemplified in FIG. 1B, would result in poor connection between traces, and insufficient drilling, as exemplified in FIG. 1C, would cause local stub residual. Both the situations would have adverse effects on the resulting high-frequency characteristic impedance, and furthermore, the yield rate of products as well as costs.

SUMMARY OF THE INVENTION

Therefore, the present invention provides an impedance matching structure of a transmission line for producing a good characteristic impedance matching circuit.

In an aspect of the present invention, the impedance matching structure includes: at least one redundant conducting section coupled to a conductive member of the transmission line between an input terminal and an output terminal of the transmission line, wherein a first terminal of the redundant conducting section is coupled to the conductive member of the transmission line, while a second terminal of the redundant conducting section is apart from the conductive member of the transmission line, and the conductive member and the redundant conducting section are disposed in a corresponding plating hole; and at least one grounding member, which is disposed adjacent to but separated from either or both of the conductive member of the transmission line and the at least one redundant conducting section in a capacitor structure for impedance matching, wherein the at least one grounding member includes a first grounding member penetrating through at least two layers of the multilayer circuit board.

In another aspect of the present invention, the impedance matching structure includes: a redundant conducting section coupled to a conductive member of the transmission line between an input terminal and an output terminal of the transmission line, and the conductive member and the redundant conducting section are disposed in a corresponding plating hole, wherein a first terminal of the redundant conducting section is coupled to the conductive member of the transmission line, while a second terminal of the redundant conducting section is open-circuit or grounded, a ground line disposed adjacent to but separated from either or both of the conductive member of the transmission line and the at least one redundant conducting section in a capacitor structure for impedance matching, wherein the ground line penetrates through at least two layers of the multilayer circuit board; and a grounded conducting section surrounding but separated from the redundant conducting section to form another capacitor structure for impedance matching.

In a further aspect, the impedance matching structure includes: a redundant conducting section coupled to a conductive member of the transmission line between an input terminal and an output terminal of the transmission line, wherein a first terminal of the redundant conducting section is coupled to the conductive member of the transmission line, while a second terminal of the redundant conducting section is open-circuit or grounded, and the conductive member and the redundant conducting section are disposed in a corresponding plating hole; a first ground line disposed adjacent to but separate from the conductive member of the transmission line to form a capacitor structure for impedance matching, wherein the first ground line penetrates through at least two layers of the multilayer circuit board; and a second ground line disposed adjacent to but separate from the redundant conducting section to form another capacitor structure for impedance matching, wherein the second ground line penetrates through at least two layers of the multilayer circuit board.

BRIEF DESCRIPTION OF THE DRAWINGS

The invention will become more readily apparent to those ordinarily skilled in the art after reviewing the following detailed description and accompanying drawings, in which:

FIG. 1A is a schematic diagram illustrating a conventional trace design implemented with a through hole;

FIG. 1B is a schematic diagram illustrating a defect of a conventional trace design implemented with back drilling;

FIG. 1C is a schematic diagram illustrating another defect of a conventional trace design implemented with back drilling;

DETAILED DESCRIPTION OF PREFERRED EMBODIMENTS

Figure 2A:
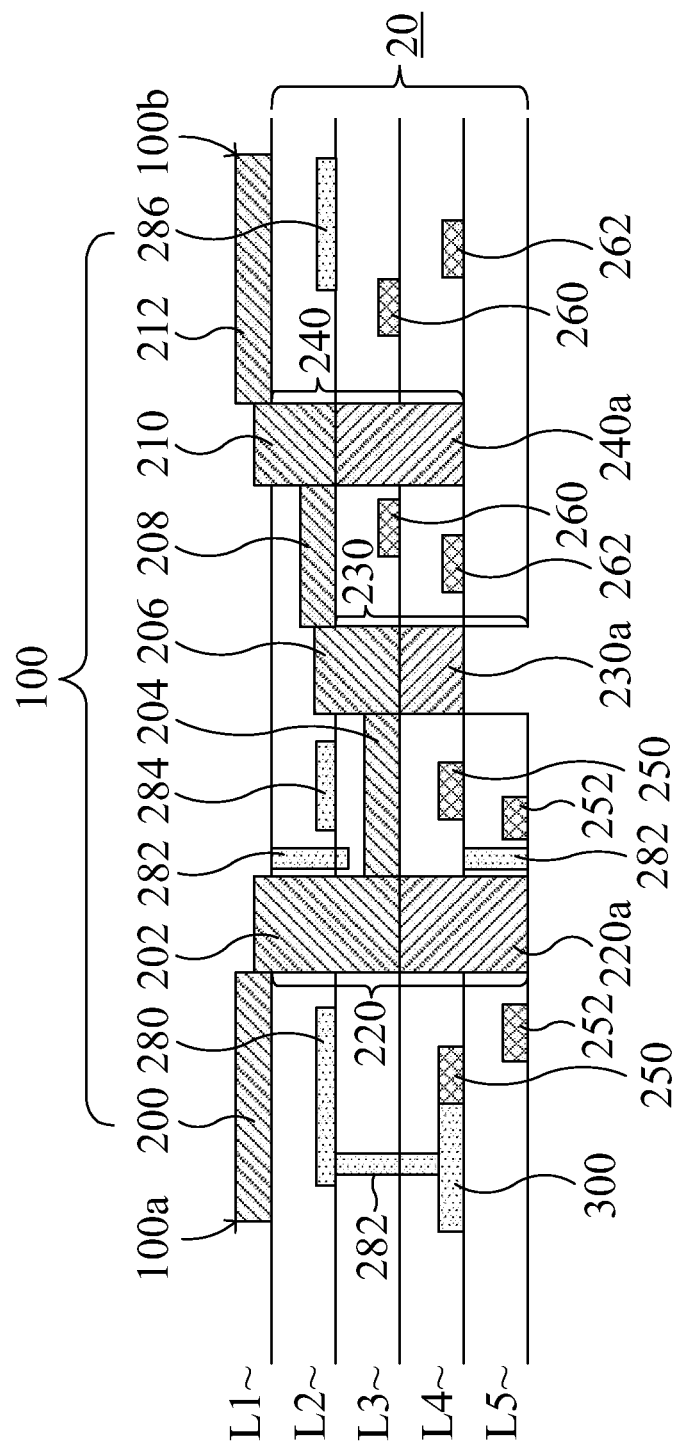
FIG. 2A is a cross-sectional view schematically illustrating an impedance matching architecture of a transmission line according to an embodiment of the present invention.

The invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Please refer to FIG. 2. A transmission line 100 is formed with conductive members 200, 202, 204, 206, 208, 210 and 212, wherein each of the conductive members is one of the sections divided from the transmission line 100. A plurality of grounding members 250, 252, 260, 262, 280, 282, 284, 286, 300 are provided, and the grounding members include various forms of ground lines or sections corresponding to the conductive members. The transmission line 100 can be divided into a plurality of sections, each including one of the conductive members. Among the conductive members in this example, the conductive members 200, 204, 208 and 212 are horizontally disposed in specified layers, respectively, and the conductive members 202, 206 and 210 are disposed in respective plating holes 220, 230 and 240. In respective plating holes 220, 230 and 240, redundant conducting sections 220a, 230a and 240a are coupled with first ends to corresponding conductive members 202, 206 and 210, while the second ends are away from the conductive members. In this embodiment, as shown, each of the plating holes 202, 206 and 210 penetrates through at least two layers of the multilayer circuit board. It is to be noted that all the grounding members are not shown in the drawing due to the viewing angle. Horizontal ground lines 280, 284 and 286, vertical ground lines 282, and grounded conducting sections 250, 252, 260 and 262 are shown as examples. Each of the horizontal ground lines 280, 284 and 286 is disposed in a specified layer. Each of the vertical ground lines 282 penetrates through at least two layers of the multilayer circuit board. Each of the grounded conducting sections 250, 252, 260 and 262 surrounds one or more of the conductive members 202, 206, 210 and/or the redundant conducting sections 220a, 230a, 240a. The grounding members can be further electrically coupled to a ground layer of the multilayer printed circuit board 20 so as to provide a grounding function. The transmission line 100 has an input terminal 100a and an output terminal 100b. Signals enter the transmission line 100 via the input terminal 100a and exit the transmission line 100 via the output terminal 100b. Furthermore, an impedance matching architecture of the transmission line 100 adopts parasitic effects. The impedance matching architecture takes advantage of parasitic effects between the transmission line and specifically allocated ground lines as matching parts. The design is another matching method in the impedance matching architecture according to the present invention besides the redundant conducting sections 220a, 230a and 240a, and grounded conducting sections 250, 252, 260 and 262 provided as parts of the impedance matching architecture in this embodiment. The local structures of the impedance matching architecture, as well as how the impedance matching architecture works, will be described in more detail hereinafter.

In the embodiment shown in FIG. 2A, the transmission line 100 and associated impedance matching structures are disposed in a multilayer printed circuit board 20. The multilayer printed circuit board 20 includes six layers of trace structure, first to sixth layers L1-L6, and a plurality of plating holes are provided therein. For example, through holes 220 and conductive structures in the through holes 220, and non-through holes 230 (buried hoe) and 240 (blind hole) and conductive structures in the non-through holes 230 and 240, are provided within the six layers of structure. The transmission line 100 routes among the layers of the multilayer printed circuit board 20 through the plating holes. For example, the transmission line 100 starts at the first layer L1 by allocating the input terminal 100a on a surface of the first layer L1, and electrically coupling the input terminal 100a to the conductive member 202 via the conductive member 200 that is also allocated on the first layer L1. The conductive member 202 is provided in the through hole 220 and further coupled to the conductive member 204, thereby transmitting signals from the conductive member 200 toward the conductive member 204. The conductive member 204 is allocated on a surface of the third layer L3, and two ends thereof are respectively electrically coupled to the conductive member 202 and the conductive member 206, thereby allowing signals to travel from the conductive member 202 toward the conductive member 206. The conductive member 206 is provided in the via 230 and further coupled to the conductive member 208, thereby transmitting signals from the conductive member 204 toward the conductive member 208. The conductive member 208 is allocated on a surface of the second layer L2, and two ends thereof are respectively electrically coupled to the conductive member 206 and the conductive member 210, thereby transmitting signals from the conductive member 206 toward the conductive member 210. The conductive member 210 is provided in the via 240 and further coupled to the conductive member 212, thereby transmitting signals from the conductive member 208 toward the conductive member 212. The conductive member 212 is allocated on a surface of the first layer L1, and two ends thereof are respectively electrically coupled to the conductive member 210 and the output terminal 100b, thereby transmitting signals from the conductive member 210 toward the output terminal 100b. It is understood by those skilled in the art that the signal transmission direction described above is just an example, and may be changed with complying design modification under the structure of the present invention.

In this embodiment, the impedance matching architecture includes specifically allocated vertical ground lines 282 and additionally formed redundant conducting sections 220a, 230a and 240a and grounded conducting sections 250, 252, 260 and 262. Nevertheless, the vertical ground lines 282, the formed redundant conducting sections 220a, 230a and 240a, and the grounded conducting sections 250, 252, 260 and 262 may be optionally formed, depending on practical circuitry and/or impedance matching designs. As shown, the conductive member 202 is disposed in a first region of the through hole 220, wherein the first region is defined from the surface or vicinity conductive region of the through hole on the first layer L1 to a similar region on the third layer L3. Meanwhile, a redundant conducting section 220a is disposed in a second region of the through hole 220, wherein the second region is the region from a surface of the third layer L3 or its vicinity through a surface of the fifth layer L5 or its vicinity. Likewise, the conductive member 206 is disposed in a first region of the via 230, i.e. the region from a surface of the second layer L2 or its vicinity through a surface of the third layer L3 or its vicinity. Meanwhile, a redundant conducting section 230a is disposed in a second region of the through hole 230, i.e. the region from a surface of the third layer L3 or its vicinity through a surface of the fourth layer L4 or its vicinity. Furthermore, a third region of the through hole 230 under the redundant conducting section 230a, e.g. from a surface of the fourth layer L4 or its vicinity through a surface of the fourth layer L5 or its vicinity, remains unfilled. Furthermore, the conductive member 210 is disposed in a first region of the via 240, i.e. the region from a surface of the first layer L1 or its vicinity through a surface of the second layer L2 or its vicinity. Meanwhile, a redundant conducting section 240a is disposed in a second region of the through hole 230, i.e. the region from a surface of the second layer L2 or its vicinity through a surface of the fourth layer L4 or its vicinity.

In an embodiment, respective first ends of the redundant conducting sections 220a, 230a and 240a are defined at contact area with their corresponding conductive members 202, 206 and 210. Meanwhile, respective second ends of the redundant conducting section 220a, 230a and 240a are defined at areas away from their corresponding conductive members 202, 206 and 210. Then, the respective first ends of redundant conducting sections 220a, 230a and 240a are coupled to somewhere different between the input terminal 100a and the output terminal 100b of the transmission line 100, while the respective second ends of redundant conducting sections 220a, 230a and 240a are not coupled to the transmission line 100. Furthermore, the redundant conducting sections 220a, 230a and 240a are apart from one another and there is no coupling among them.

In the above embodiment, the redundant conducting section 220a and the conductive member 202 are disposed in the same hole 220, the redundant conducting section 230a and the conductive member 206 are disposed in the same hole 230, and the redundant conducting section 240a and the conductive member 210 are disposed in the same hole 240. Nevertheless, the disposition of a redundant conducting section and an inside conductive member in a common plating hole, either through hole or non-through hole, is not essential to the present invention. When proper, redundant conducting section according to the present invention may alternatively be disposed in an exclusive plating hole. Furthermore, in consideration of characteristic impedance design, it is preferred that the material of the redundant conducting section and the material of the conductive member disposed in the same plating hole are the same, but it is not necessary. For example, a strip line may be used.

Furthermore, a grounded conducting section 250 is allocated at a surface of the fourth layer L4 around the redundant conducting section 220a; a grounded conducting section 252 is allocated at a surface of the fifth layer L5 around the redundant conducting section 220a; a grounded conducting section 260 is allocated at a surface of the third layer L3 around the redundant conducting section 240a; and a grounded conducting section 262 is allocated at a surface of the fourth layer L4 around the redundant conducting section 240a. The grounded conducting sections and the redundant conducting sections are apart from one another. By specially configuring the grounded conducting sections, for example, with specially designed dimensions, shapes, etc., a capacitance value of a capacitor structure formed between a redundant conducting section and a corresponding grounded conducting section can be adjusted so as to achieve the object of impedance matching.

Figure 2B:
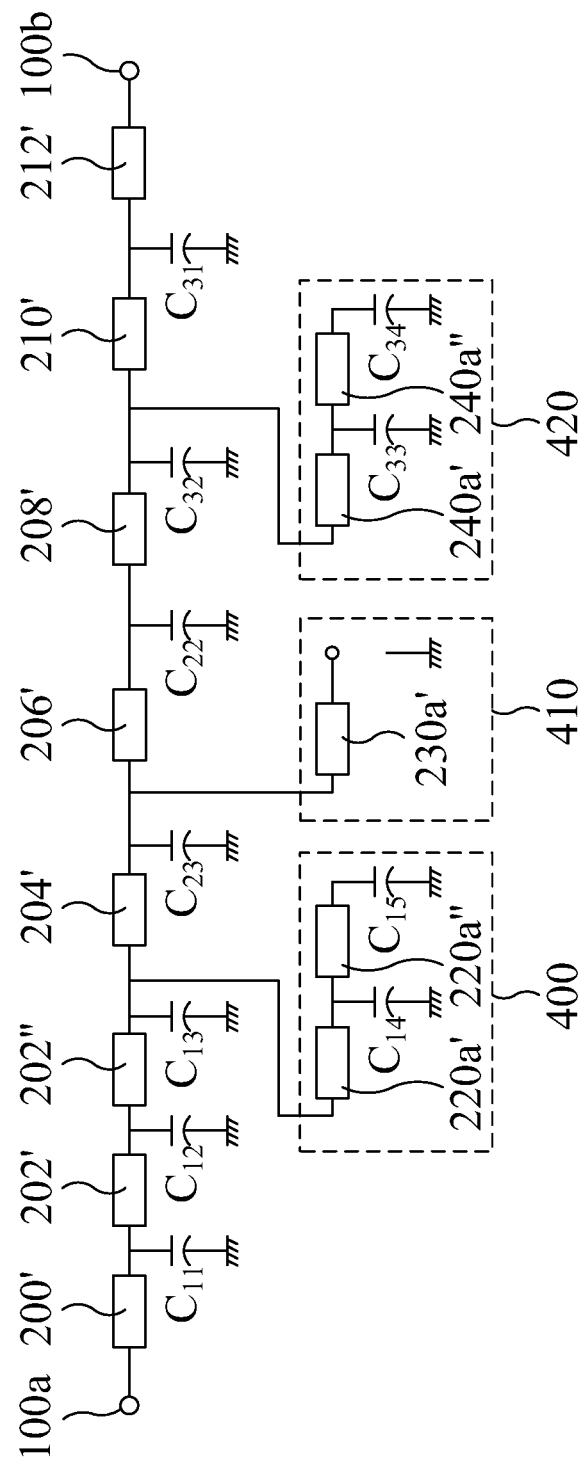
FIG. 2B is a schematic equivalent circuit block diagram of a transmission line and its impedance matching structure according to an embodiment of the present invention.

In the embodiment illustrated in FIG. 2A, the second ends of the redundant conducting sections 220a, 230a and 240a are all floating, i.e. open-circuit. Therefore, the transmission line and its impedance matching structure as shown in FIG. 2A can be expressed as an equivalent circuit as shown in FIG. 2B. In the equivalent circuit of FIG. 2B, the circuit module 200' is equivalent to the conductive member 200; the circuit module 202' is equivalent to a portion of the conductive member 202 between the first layer L1 and the second layer L2; the circuit module 202" is equivalent to a portion of the conductive member 202 between the second layer L2 and the third layer L3; the circuit module 204' is equivalent to the conductive member 204; the circuit module 206' is equivalent to the conductive member 206; the circuit module 208' is equivalent to the conductive member 208; the circuit module 210' is equivalent to the conductive member 210; the circuit module 212' is equivalent to the conductive member 212; the circuit module 400 is equivalent to the redundant conducting section 220a and its corresponding grounded conducting sections 250 and 252; the circuit module 410 is equivalent to the redundant conducting section 230a and its corresponding grounded conducting sections 250 and 262; and the circuit module 420 is equivalent to the redundant conducting section 240a and its corresponding grounded conducting sections 260 and 262.

In this embodiment, referring to FIG. 2A and FIG. 2B from left to right, the input terminal 100a of the transmission line 100 is electrically coupled to one terminal of the equivalent circuit module 200', another terminal of equivalent circuit module 200' is electrically coupled to the equivalent capacitor $C_{11}$ and one terminal of the equivalent circuit module 202'. Another terminal of the equivalent circuit module 202' is electrically coupled to the equivalent capacitor $C_{12}$ and one terminal of the equivalent circuit module 202". Another terminal of the equivalent circuit module 202" is electrically coupled to the equivalent capacitor $C_{13}$, the equivalent circuit module 400, and one terminal of the equivalent circuit module 204'. Another terminal of the equivalent circuit module 204" is electrically coupled to the equivalent capacitor $C_{23}$, the equivalent circuit module 410, and one terminal of the equivalent circuit module 206'. Another terminal of the equivalent circuit module 206' is electrically coupled to the equivalent capacitor $C_{22}$ and one terminal of the equivalent circuit module 208'. Another terminal of the equivalent circuit module 208' is electrically coupled to the equivalent capacitor $C_{32}$, the equivalent circuit module 420, and one terminal of the equivalent circuit module 210'. Another terminal of the equivalent circuit module 210' is electrically coupled to the equivalent capacitor $C_{31}$ and one terminal of the equivalent circuit module 212'. Another terminal of the equivalent circuit module 212' is electrically coupled to the output terminal 100b of the transmission lone 100.

Furthermore, the equivalent circuit module 400 includes an equivalent circuit module 220a', equivalent circuit module 220a", equivalent capacitor $C_{14}$ and equivalent capacitor $C_{15}$. The equivalent circuit module 220a' is a portion of the redundant conducting section 220a between the third layer L3 and the fourth layer L4. The equivalent circuit module 220a" is a portion of the redundant conducting section 220a between the fourth layer L4 and the fifth layer L5. The equivalent circuit module 410 includes an equivalent circuit module 230a', and an equivalent open circuit and its corresponding ground, i.e. a reference ground equivalent to the equivalent circuit module 410, wherein the equivalent circuit module 230a' is equivalent to the redundant conducting section 230a. The equivalent circuit module 420 includes an equivalent circuit module 240a', equivalent circuit module 240a", equivalent capacitor $C_{34}$ and equivalent capacitor $C_{34}$. The equivalent circuit module 240a' is a portion of the redundant conducting section 240a between the second layer L2 and the third layer L3. The equivalent circuit module 240a" is a portion of the redundant conducting section 240a between the third layer L3 and the fourth layer L4. One terminal of the equivalent circuit module 220a' is electrically coupled to the equivalent circuit module 202", and another end thereof is electrically coupled to the equivalent capacitor $C_{14}$ and one terminal of the equivalent circuit module 220a". Another terminal of the equivalent circuit module 220a" is electrically coupled to the equivalent capacitor $C_{15}$. One terminal of the equivalent circuit module 230a' is electrically coupled to the equivalent circuit module 204', and another terminal thereof is open-circuit. One terminal of the equivalent circuit module 240a' is electrically coupled to the equivalent circuit module 208', and another end thereof is electrically coupled to the equivalent capacitor $C_{33}$ and one terminal of the equivalent circuit module 240a". Another terminal of the equivalent circuit module 240a" is electrically coupled to the equivalent capacitor $C_{34}$.

The effects of the capacitors $C_{11}$-$C_{15}$, $C_{22}$-$C_{23}$ and $C_{31}$-$C_{34}$ can be implemented by proper designing or modifying the impedance matching architecture illustrated in FIG. 2A. Hereinafter, a variety of examples of impedance matching structures are given as follows. The impedance matching structures principally follow or derive from the impedance matching architecture illustrated in FIG. 2A.

By adjusting the impedance values of the above-described equivalent circuit modules 220a' and 220a", e.g. adjusting the length of the redundant conducting section 220a, the overall impedance of the transmission line 100 can be varied, thereby making the impedance lie within a practically required range or be a practically required value. Likewise, the overall impedance may alternatively be adjusted by adjusting the length of the redundant conducting sections 230a and/or 240a. In addition, the change of dimensions and/or shapes of one or a plurality of the grounded conducting sections, and/or the change of space between one or a plurality of the grounded conducting sections and its or their corresponding conductive member(s) or redundant conducting section(s) may also have effects on the overall impedance of the transmission line 100. Furthermore, the overall impedance of the transmission line 100 may be adjusted with the impedance value of the equivalent circuit module 204' and 208'. It is understood that the characteristic impedance values of different sections of the transmission line 100 might be different from one another, and the overall impedance of the transmission line 100 may be adjusted to a default impedance value with the characteristic impedance values of the sections. In this way, the impedance associated with a combination of the portion of the transmission line between the input terminal 100a and the output terminal 100b and the redundant conducting sections 220a-240a can be matched to the impedance of the circuit portion before the input terminal 100a; and meanwhile, the impedance associated with a combination of the portion of the transmission line between the input terminal 100a and the output terminal 100b and the redundant conducting sections 220a-240a can be matched to the impedance of the circuit portion after the output terminal 100b.

It is to be noted that in a case that a redundant conducting section is open-circuit at an end away from the transmission line, an equivalent capacitor would be configured in an equivalent circuitry. On the other hand, in a case that a redundant conducting section is short-circuit at an end away from the transmission line, an equivalent inductor would be configured in an equivalent circuitry. Furthermore, if it is necessary to shorten the length of the redundant conducting section in a plating hole, a back drilling technique or any other suitable technique known to those skilled in the art may be adopted. The known art would not be redundantly described herein.

Figure 3A:
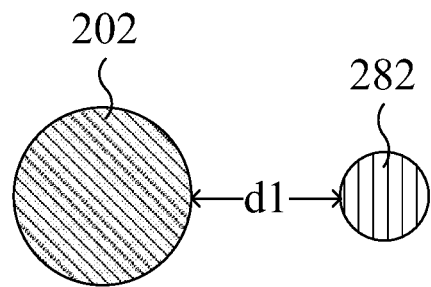
FIGS. 3A and 3B are schematic diagrams illustrating embodiments of impedance matching structures of a transmission line according to the present invention, wherein the impedance matching structures interact with a conductive member of the transmission line.

According to the present invention, the vertical ground lines 282 as shown in FIG. 2A can be used for impedance matching in addition to the primitive grounding function. Each of the vertical ground lines 282 can be arranged at any suitable layer or layers, and may vertically extend through one or more layers to adjust a capacitance value of a capacitor structure by changing a gap distance between the vertical ground line 282 and the conductive member 202 and/or redundant conducting section 220a. FIG. 3A schematically illustrates a cross-sectional diagram in one of the layers of a multilayer printed circuit board according to the present invention, in which the vertical ground line 282 is disposed adjacent and in parallel to the conductive member 202 and has a distance d1 from the conductive member 202. By varying the distance d1, the capacitance between the vertical ground line 282 and the conductive member 202 can be properly adjusted.

Figure 3B:
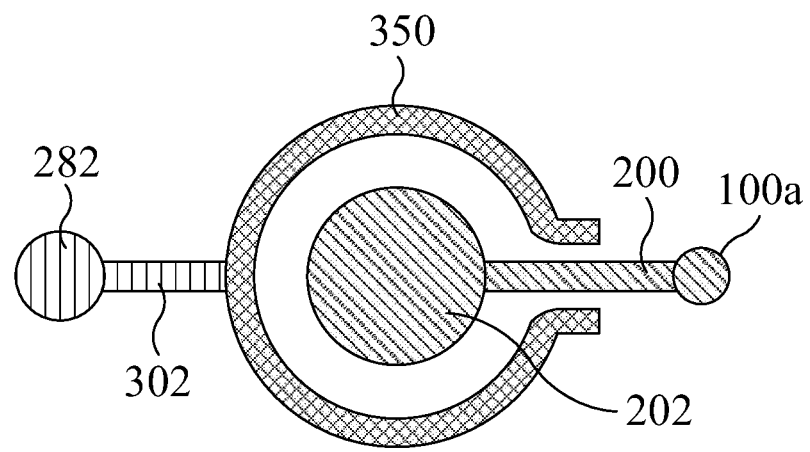

In an alternative embodiment, a grounded conducting section 350 may be formed around the conductive member 202, and the vertical ground line 282 is electrically connected to the grounded conducting section 350 via a trace 302 and extends in parallel to the conductive member 202, as illustrated in FIG. 3B. FIG. 3B schematically illustrates a cross-sectional view in one of the layers of a multilayer printed circuit board according to the present invention. The capacitance of the resulting structure may vary by adjusting the distance between the grounded conducting section 350 and the conductive member 202, and the distance between the vertical ground line 282 and the conductive member 202 to obtain different equivalent circuit modules 202' and 202" in FIG. 2B.

Figure 4A:
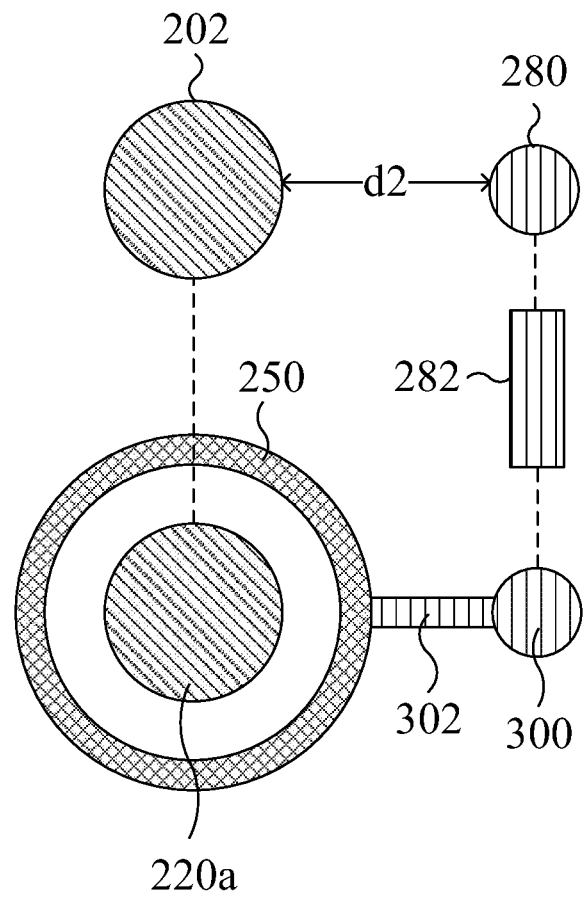
FIGS. 4A, 4B and 4C are schematic diagrams respectively illustrating three embodiments of impedance matching structures of a transmission line according to the present invention, wherein each of the impedance matching structures interacts with both a conductive member of the transmission line and a corresponding redundant conducting section.
Figure 4B:
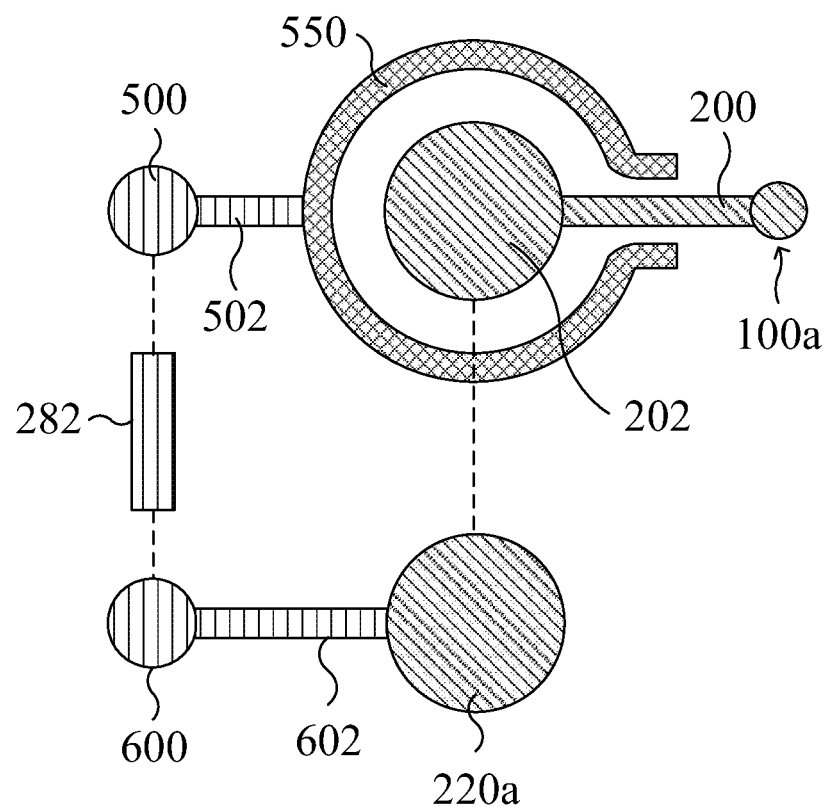
Figure 4C:
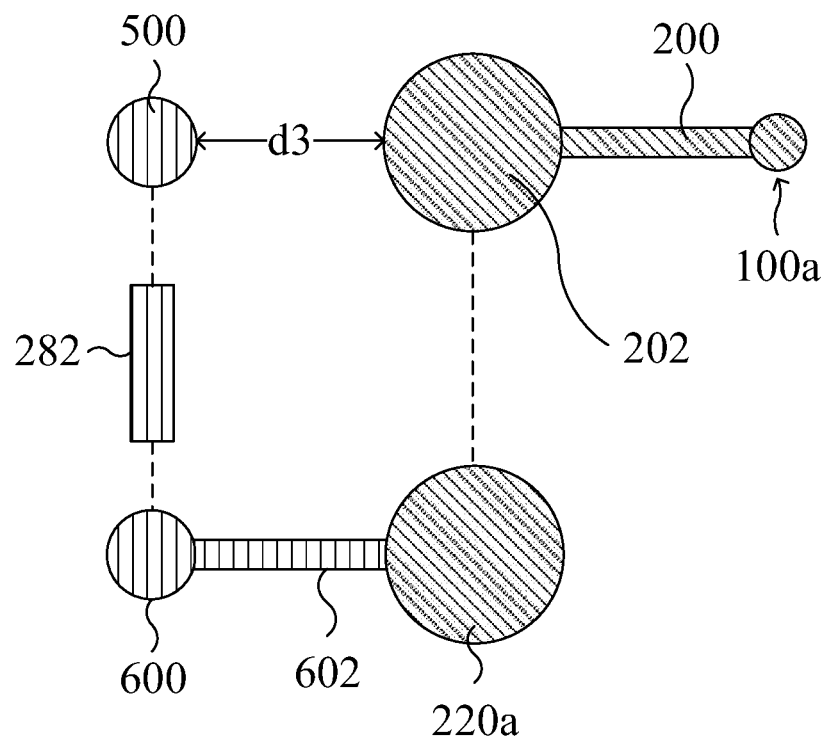

FIGS. 4A, 4B and 4C schematically illustrate further embodiments. It is to be noted that FIG. 4A, FIG. 4B and FIG. 4C are schematically presented in a mixed manner, in which each upper portion and each lower portion are cross-sectional views in certain layers, and the upper and lower horizontal ground lines are electrically interconnected via vertical ground lines 282. Furthermore, the conductive member 202 and the redundant conducting section 220a may be, but not necessarily, disposed in the same plating hole. In the embodiment illustrated in FIG. 4A, the vertical ground line 282 partially extends in parallel to the conductive member 202 with a distance d2 from the conductive member 202, and partially extends in parallel to the redundant conducting section 220a provided in the same plating hole as the conductive member 202, and meanwhile, the vertical ground line 282 is electrically connected to the grounded conducting section 250 surrounding the redundant conducting section 220a. The capacitance of the resulting structure may vary by adjusting the distance between the grounded conducting section 250 and the redundant conducting section 220a and the distance d2 of the vertical ground line 282 from the conductive member 202 and the redundant conducting section 220a.

In the embodiment illustrated in FIG. 4B, a grounded conducting section 550 is disposed around the conductive member 202 and electrically connected to a ground line 500, and the redundant conducting section 220a in the same plating hole as the conductive member 202 is directly connected to a ground line 600 via a trace 602. Meanwhile, the ground lines 500 and 600 are interconnected via a vertical ground line 282. In this embodiment, the capacitance of the resulting structure may vary by adjusting the distance between the grounded conducting section 550 and the conductive member 202, and the distance of the vertical ground line 282 from the redundant conducting section 220a and the conductive member 202. It is to be noted that the in this embodiment, the structured formed with the redundant conducting section 220a and the ground line 600 are characteristically equivalent to a capacitor structure since the redundant conducting section 220a is grounded and serves as a reflecting terminal.

The embodiment illustrated in FIG. 4C is similar to that illustrated in FIG. 4B except that the grounded conducting section 550 and the trace 502 are omitted. Instead, the ground line 500 has a distance d3 from the conductive member 202.

Figure 5:
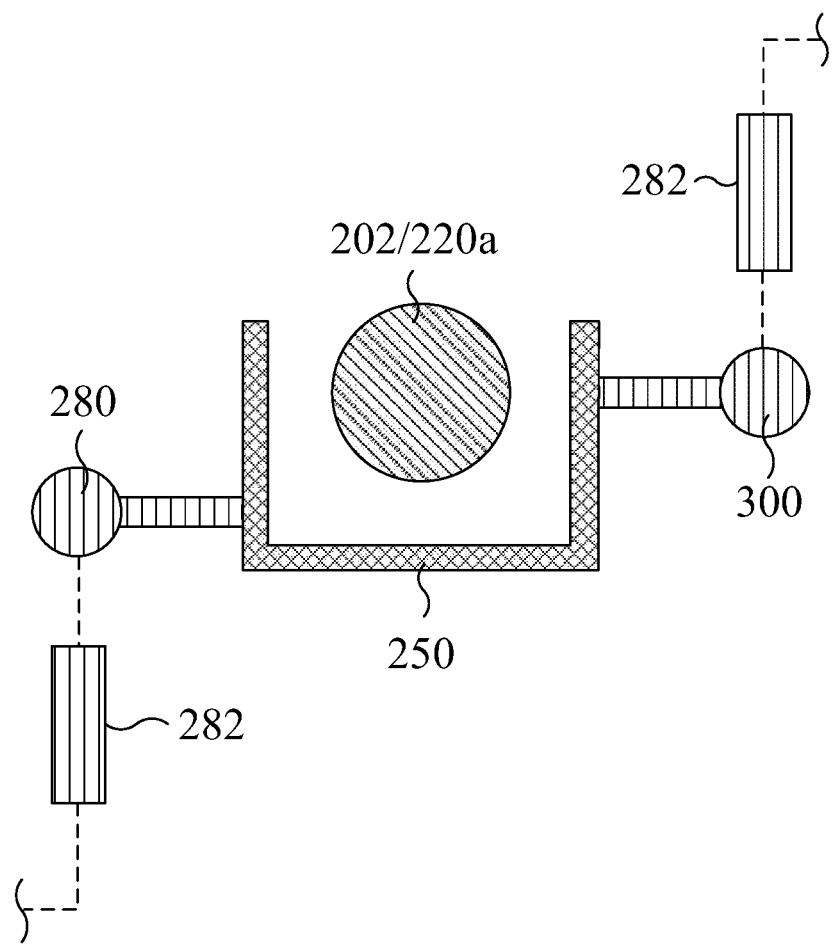
FIG. 5 is a schematic diagram illustrating an impedance matching structure of a transmission line according to another embodiment of the present invention.

FIG. 5 illustrates an impedance matching structure of a transmission line according to another embodiment of the present invention. In this embodiment, the grounded conducting section 250 surrounding the conductive member 202 and/or redundant conducting section 220a is electrically connected to two ground lines 280 and 300, and each of the two ground lines 280 and 300 is electrically connected to a vertical ground line 282. Accordingly, the capacitance of the resulting structure may vary by adjusting the distance between the grounded conducting section 250 and the conductive member 202 and/or redundant conducting section 220a, and the distances between the vertical ground lines 282 and the conductive member 202 and/or redundant conducting section 220a, respectively.

Figure 6:
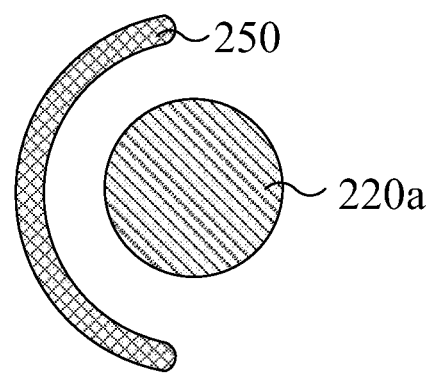
FIG. 6 is a schematic diagram exemplifying an alternative configuration of the grounded conducting section applicable to the impedance matching structures of the present invention.

In the above embodiments, different shapes of grounded conducting sections 250/550 are shown as examples. Alternatively, the grounded conducting section may also be of any other suitable shape, such as a half-ring as illustrated in FIG. 6.

Figure 7:
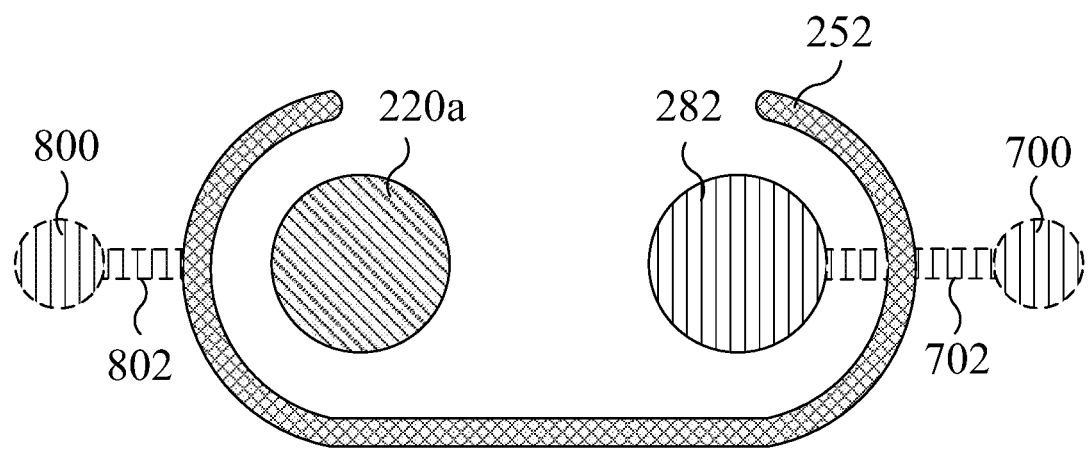
FIG. 7 is a schematic diagram illustrating an impedance matching structure of a transmission line according to a further embodiment of the present invention.

As described above, a vertical ground line 282 may be disposed in parallel to the conductive member 202 and/or redundant conducting section 220a to adjust the distances and shapes of ground members to obtain equivalent capacitance for impedance matching. For achieving this object, it is desirable that the vertical ground line 282 is disposed close to the conductive member 202 and/or redundant conducting section 220a. For example, as illustrated in FIG. 7, the vertical ground line 282 is surrounded, together with the redundant conducting section 220a, by the grounded conducting sections 250.

It is to be noted that the term "in parallel to" used hereinbefore means substantially extending in the same direction rather than an exactly parallel configuration.

The impedance matching structure of a transmission line according to the present invention is not limited to the above-described embodiments, and may be implemented with alternative means. For example, the matching with the impedance of the transmission line constructed by the conductive members 202, 204 and 206 and their corresponding ground lines can be accomplished with the redundant conducting sections 220a and 230a. The matching with the impedance of the transmission line constructed by the conductive member 204 and its corresponding ground line can also be accomplished with the redundant conducting sections 220a and 230a.

While the prior art independently deals with the impedance matching of different conductive members, e.g. conductive members 202, 204 and 206, the present invention deals with the overall impedance matching of the entire transmission line, e.g. the transmission line 100, with redundant conducting sections. Therefore, it is not necessary to remove all the redundant conducting sections. Even if the redundant conducting sections are required to be removed, for example by way of back drilling, the undesired effect of poor connection in FIG. 1 between via and traces due to over drilling can be avoided. Furthermore, since over drilling is not an issue any more, the tolerance remained for back drilling which is dealt with as the art of matching can be made small. Under this circumstance, insufficient drilling would not be an issue, either. To sum up, a circuit with a good impedance matching property can be easily produced according to the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures. For example, in spite hardware devices are exemplified as above in order to practice the redundancy power supply system and the power control circuit according to the present invention, hardware/software hybrid modules or firmware designs may also adopted as alternatives of the devices when appropriate.

What is claimed is:

1. An impedance matching structure, disposed on a multilayer circuit board for matching an impedance of a transmission line for transmitting an electronic signal, and comprising:

at least one redundant conducting section coupled to a conductive member of the transmission line between an input terminal and an output terminal of the transmission line, wherein a first terminal of the redundant conducting section is coupled to the conductive member of the transmission line, while a second terminal of the redundant conducting section is apart from the conductive member of the transmission line, and the conductive member and the redundant conducting section are disposed in a corresponding plating hole; and at least one grounding member disposed adjacent to but separated from either or both of the conductive member of the transmission line and the at least one redundant conducting section in a capacitor structure for impedance matching,
wherein the at least one grounding member includes a first grounding member penetrating through at least two layers of the multilayer circuit board.

2. The impedance matching structure according to claim 1, wherein the first grounding member vertically penetrates through the at least two layers of the multilayer circuit board.

3. The impedance matching structure according to claim 2, wherein the corresponding plating hole, where the conductive member and the redundant conducting section are disposed, vertically penetrates through at least two layers of the multilayer circuit board and is substantially parallel to the first grounding member.

4. The impedance matching structure according to claim 2, wherein the at least one grounding member further includes second grounding members, which are horizontally disposed in different layers of the multilayer circuit board, respectively, and interconnected via the first grounding member.

5. The impedance matching structure according to claim 4, wherein the at least one grounding member further includes a third grounding member, which surrounds either or both of the redundant conducting section and the conductive member in the corresponding plating hole, and is in separation from the redundant conducting section and/or conductive member to form another capacitor structure for impedance matching, and the third grounding member is electrically connected to the first or second grounding line via a trace.

6. The impedance matching structure according to claim 5, wherein the first grounding member is disposed between the corresponding plating hole and the third grounding member.

7. The impedance matching structure according to claim 1, wherein the at least one grounding member further includes second grounding members, which are disposed in different layers of the multilayer circuit board, respectively, and interconnected via the first grounding member.

8. The impedance matching structure according to claim 1, wherein the redundant conducting section is electrically connected to a first or a second of said at least one grounding member via a trace.

9. The impedance matching structure according to claim 1, wherein the second terminal of the redundant conducting section is open-circuit or grounded.

10. The impedance matching structure according to claim 1, wherein an impedance associated with a combination of a portion of the transmission line between the input terminal and the output terminal and the at least one redundant conducting section match with an impedance of a circuit portion before the input terminal or an impedance of a circuit portion after the output terminal.

11. The impedance matching structure according to claim 1, wherein the redundant conducting section occupies one portion of the corresponding plating hole, and the portion of the transmission line occupies the other portion of the corresponding plating hole.

12. The impedance matching structure according to claim 1, wherein the transmission line includes sections with different characteristic impedances.

13. An impedance matching structure, disposed on a multilayer circuit board for matching an impedance of a transmission line for transmitting an electronic signal, and comprising:

a redundant conducting section coupled to a conductive member of the transmission line between an input terminal and an output terminal of the transmission line, wherein a first terminal of the redundant conducting section is coupled to the conductive member of the transmission line, while a second terminal of the redundant conducting section is open-circuit or grounded, and the conductive member and the redundant conducting section are disposed in a corresponding plating hole;

a ground line disposed adjacent to but separated from either or both of the conductive member of the transmission line and the at least one redundant conducting section in a capacitor structure for impedance matching, wherein the ground line penetrates through at least two layers of the multilayer circuit board; and a grounded conducting section surrounding and separated from the redundant conducting section to form another capacitor structure for impedance matching.

14. The impedance matching structure according to claim 13, wherein the ground line vertically penetrates through the at least two layers of the multilayer circuit board, and the corresponding plating hole vertically penetrates through at least two layers of the multilayer circuit board and is substantially parallel to the ground line.

15. The impedance matching structure according to claim 13, wherein the ground line connects at least two other ground lines horizontally disposed in different layers of the multilayer circuit board, respectively.

16. The impedance matching structure according to claim 15, wherein the grounded conducting section is electrically connected to any of the ground lines via a trace.

17. The impedance matching structure according to claim 15, wherein the redundant conducting section is electrically connected to any of the ground lines via a trace.

18. The impedance matching structure according to claim 13, wherein the ground line is disposed between the corresponding plating hole and the grounded conducting section.

19. An impedance matching structure, disposed on a multilayer circuit board for matching an impedance of a transmission line for transmitting an electronic signal, and comprising:

a redundant conducting section coupled to a conductive member of the transmission line between an input terminal and an output terminal of the transmission line, wherein a first terminal of the redundant conducting section is coupled to the conductive member of the transmission line, while a second terminal of the redundant conducting section is open-circuit or grounded, and the conductive member and the redundant conducting section are disposed in a corresponding plating hole;

a first ground line disposed adjacent to but separate from the conductive member of the transmission line to form a capacitor structure for impedance matching, wherein the first ground line penetrates through at least two layers of the multilayer circuit board; and a second ground line disposed adjacent to but separate from the redundant conducting section to form another capacitor structure for impedance matching, wherein the second ground line penetrates through at least two layers of the multilayer circuit board.

20. The impedance matching structure according to claim 19, further comprising a grounded conducting section surrounding the redundant conducting section, and in separation from the redundant conducting section to form a further capacitor structure for impedance matching.

* * * * *